United States Patent
Lu et al.

(10) Patent No.: US 9,570,600 B2
(45) Date of Patent: Feb. 14, 2017

(54) SEMICONDUCTOR STRUCTURE AND RECESS FORMATION ETCH TECHNIQUE

(71) Applicant: Massachusetts Institute of Technology, Cambridge, MA (US)

(72) Inventors: Bin Lu, Boston, MA (US); Min Sun, Cambridge, MA (US); Tomas Apostol Palacios, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/442,546

(22) PCT Filed: Nov. 15, 2013

(86) PCT No.: PCT/US2013/070372
§ 371 (c)(1),
(2) Date: May 13, 2015

(87) PCT Pub. No.: WO2014/078699
PCT Pub. Date: May 22, 2014

(65) Prior Publication Data
US 2016/0064539 A1    Mar. 3, 2016

Related U.S. Application Data

(60) Provisional application No. 61/727,333, filed on Nov. 16, 2012.

(51) Int. Cl.
*H01L 29/15* (2006.01)
*H01L 29/778* (2006.01)
(Continued)

(52) U.S. Cl.
CPC ..... *H01L 29/7787* (2013.01); *H01L 21/30612* (2013.01); *H01L 21/30621* (2013.01);
(Continued)

(58) Field of Classification Search
CPC ............. H01L 29/7786; H01L 29/7787; H01L 29/205; H01L 29/4175; H01L 29/4236; H01L 29/66462; H01L 29/2003
See application file for complete search history.

(56) References Cited

U.S. PATENT DOCUMENTS 6,982,204 B2    1/2006    Saxler et al.
7,045,404 B2    5/2006    Sheppard et al.
(Continued)

FOREIGN PATENT DOCUMENTS

| JP | 2007-035905 A | 2/2007 |
|---|---|---|
| WO | WO 2013/010829 A1 | 1/2013 |
| WO | WO 2013/095643 A1 | 6/2013 |

OTHER PUBLICATIONS

Partial Supplementary European Search Repot dated Jun. 28, 2016 for European Application No. 13854428.3.
(Continued)

*Primary Examiner* — Nicholas Tobergte
(74) *Attorney, Agent, or Firm* — Wolf, Greenfield & Sacks, P.C.

(57) ABSTRACT

A semiconductor structure has a first layer that includes a first semiconductor material and a second layer that includes a second semiconductor material. The first semiconductor material is selectively etchable over the second semiconductor material using a first etching process. The first layer is disposed over the second layer. A recess is disposed at least in the first layer. Also described is a method of forming a semiconductor structure that includes a recess. The method includes etching a region in a first layer using a first etching process. The first layer includes a first semiconductor material. The first etching process stops at a second layer beneath the first layer. The second layer includes a second semiconductor material.

45 Claims, 11 Drawing Sheets

(51) Int. Cl.
*H01L 29/66* (2006.01)
*H01L 21/306* (2006.01)
*H01L 29/205* (2006.01)
*H01L 29/417* (2006.01)
*H01L 29/423* (2006.01)
*H01L 29/20* (2006.01)

(52) U.S. Cl.
CPC ........ *H01L 29/205* (2013.01); *H01L 29/4175* (2013.01); *H01L 29/4236* (2013.01); *H01L 29/66462* (2013.01); *H01L 29/7786* (2013.01); *H01L 29/2003* (2013.01); *H01L 29/41766* (2013.01)

(56) References Cited

U.S. PATENT DOCUMENTS

| | | | |
|---|---|---|---|
| 8,124,505 B1 | 2/2012 | Burnham et al. | |
| 8,338,241 B2 | 12/2012 | Yoon et al. | |
| 8,431,962 B2 | 4/2013 | Heying et al. | |
| 8,519,438 B2 | 8/2013 | Mishra et al. | |
| 9,331,190 B2 * | 5/2016 | Kanamura | H01L 29/778 |
| 2007/0018199 A1 | 1/2007 | Sheppard et al. | |
| 2008/0224183 A1* | 9/2008 | Nawaz | H01L 29/66795 257/279 |
| 2009/0267078 A1 | 10/2009 | Mishra et al. | |
| 2011/0108887 A1 | 5/2011 | Fareed et al. | |
| 2011/0254134 A1 | 10/2011 | Detchprohm et al. | |
| 2012/0056191 A1 | 3/2012 | Endo et al. | |
| 2012/0149161 A1* | 6/2012 | Ohki | H01L 29/7786 438/270 |
| 2013/0292698 A1 | 11/2013 | Then et al. | |
| 2013/0313561 A1 | 11/2013 | Suh | |

OTHER PUBLICATIONS

International Search Report and Written Opinion mailed Apr. 10, 2014 for Application No. PCT/US2013/070372.
International Preliminary Report on Patentability mailed May 28, 2015 for Application No. PCT/US2013/070372.
Buttari et al, Selective dry etching of gan over algan in bcl3/sf6 mixtures. Int. J. High Speeed Electronics Syst. 2004;14(3):132-7.
Buttari et al., Digital etching for highly reproducible low damage gate recessing on AlGaN/GaN HEMTs. High Performance Devices. 2002 Proceedings. IEEE Lester Eastman Conference on IEEE. 2002; 461-9.
Chen et al., Cl2 reactive ion etching for gate recessing of AlGaN/GaN field-effect transistors. Journal of Vacuum Science & Technology B: Microelectronics and Nanometer Structures 1999; 17: 2755-8.
Chu et al., V-Gate GaN HEMTs with Engineered Buffer for Normally Off Operation. IEEE Electron Device Letters. Nov. 2008; 29(11):1184-6.
Chung et al., AlGaN/GaN HEMT with 300-GHz fmax,. IEEE Electron Device Lett. 2010131(3):195-7.
Kanamura et al., Enhancement-Mode GaN MIS-HEMTs with n-GaN/i-AlN/n-GaN Triple Cap Layer and High-k Gate Dielectrics. IEEE Electron Device Lett. 2010;31(3):189-91.
Keogh et al., Digital etching of III-N materials using a two-step Ar/KOH technique. Journal of electronic materials. 2006; 35(4):771-6.
Lu et al., An Etch-Stop Barrier Structure for GaN High-Electron-Mobility Transistors. IEEE Electron Device Letters. Mar. 2013; 34(3):369-71.
Lu et al., High-Performance Integrated Dual-Gate AiGaN/GaN Enhancement-Mode Transistor. IEEE Elecctron Device Lett. 2010;31(9):990-2.
Lu et al., Tri-Gate Normally-Off GaN Power MISFET. IEEE Electron Device Lett. 2012;33(3):360-2.
Oka et al., AlGaN/GaN Recessed MIS-Gate HFET with High-Threshold-Voltage Normally-Off Operation for Power Electronics Applications. IEEE Electron Device Lett. 2008;29(7):668-70.
Palacios et al., Nitride-based high electron mobility transistors with a GaN space. Applied Physics Letters. 2006; 89:073508. 4 pages.
Shin et al., Origin and passivation of fixed charge in atomic layer deposited aluminum oxide gate insulators on chemically treated InGaAs substrates. Appl. Phys. Lett. 2010;96:152908. 3 pages.
Wang et al., High-Performance Normally-Off $Al_2O_3$/GaN MOSFET Using a Wet Etching-Based Gate Recess Technique. IEEE Electron Device Letters. Nov. 2013; 34(11):1370-2.
Xing et al., Gallium nitride based transistors. Journal of Physics: Condensed Matter. 2001; 13 (32):7139-57.
Xu et al., Fabrication of Normally Off AlGaN/GaN MOSFET Using a Self-Terminating Gate Recess Etching Technique. Electron Device Letters IEEE. 2013; 34(7): 855-7.

* cited by examiner

SEMICONDUCTOR STRUCTURE AND RECESS FORMATION ETCH TECHNIQUE

CROSS-REFERENCE TO RELATED APPLICATIONS

This application is a U.S. National Stage of PCT/US2013/070372, filed Nov. 15, 2013, and titled "SEMICONDUCTOR STRUCTURE AND RECESS FORMATION ETCH TECHNIQUE," which claims the benefit under 35 U.S.C. §119(e) of U.S. provisional application Ser. No. 61/727,333, titled "Structure and Etch Technology for III-Nitride Semiconductors," filed Nov. 16, 2012, each of which is hereby incorporated herein by reference in its entirety.

STATEMENT REGARDING FEDERALLY SPONSORED RESEARCH OR DEVELOPMENT

This invention was made with Government support under Grant No. DE-AR0000123 awarded by the Department of Energy and under Grant No. N00014-12-1-0959 awarded the Office of Naval Research. The Government has certain rights in the invention.

BACKGROUND

1. Field of Invention

Described herein are semiconductor structures and processes for forming semiconductor structures. Etching techniques are described for forming a recess in a semiconductor structure, such as a gate recess of a transistor. Such techniques can be used to produce high performance transistors for use in power electronics, power amplification and digital electronics, by way of example.

2. Discussion of the Related Art

Improved power transistors are desired for advanced transportation systems, more robust energy delivery networks and new approaches to high-efficiency electricity generation and conversion. Applications of power transistors include power supplies, automotive electronics, automated factory equipment, motor controls, traction motor drives, high voltage direct current (HVDC) electronics, lamp ballasts, telecommunications circuits and display drives, for example. Such systems rely on efficient converters to step-up or step-down electric voltages, and use power transistors capable of blocking large voltages and/or carrying large currents. In hybrid vehicles, for example, power transistors with blocking voltages of more than 500 V are used to convert DC power from the batteries to AC power to operate the electric motor.

Conventional power devices (e.g., transistors or diodes) used in such applications are made of silicon. However, the limited critical electric field of silicon and its relatively high resistance causes available commercial devices, circuits and systems to be very large and heavy, and operate at low frequencies. Therefore, such commercial devices are unsuitable for future generations of hybrid vehicles and other applications.

Nitride semiconductor devices have been proposed as offering the potential for producing high-efficiency power electronics demanding high blocking voltages and low on-resistances.

SUMMARY

Some embodiments relate to a transistor that includes a channel layer and a barrier layer. The barrier layer has a first layer that includes a first semiconductor material and a second layer that includes a second semiconductor material. The first layer is disposed over the second layer. The first semiconductor material is selectively etchable over the second semiconductor material using a dry etching process. A gate recess is disposed at least in the first layer. A gate is disposed in the gate recess.

Some embodiments relate to a semiconductor structure that has a first layer that includes a first semiconductor material and a second layer that includes a second semiconductor material. The first layer is disposed over the second layer. The first semiconductor material is selectively etchable over the second semiconductor material using a dry etching process. A recess is disposed at least in the first layer.

Some embodiments relate to a semiconductor structure that has a first layer that includes a first semiconductor material and a second layer that includes a second semiconductor material. The first layer is disposed over the second layer. The first semiconductor material is selectively etchable over the second semiconductor material using a first etching process. A recess is disposed at least in the first layer.

Some embodiments relate to a method of forming a semiconductor structure that includes a recess. The method includes etching a region in a first layer using a first etching process. The first layer includes a first semiconductor material. The first etching process stops at a second layer beneath the first layer. The second layer includes a second semiconductor material. The first semiconductor material comprises a first III-N semiconductor material. The second semiconductor material comprises a second semiconductor material.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Gate recess is an important technology for certain types of transistors, including nitride semiconductor based transistors such as AlGaN/GaN high-electron-mobility transistors (HEMTs), for example. In radio frequency (RF) AlGaN/GaN HEMTs, a gate recess technique has been used to reduce short channel effects and improve the current gain cut-off frequency ($f_t$). In power switching applications, gate recess has been used to fabricate normally-off field effect transistors, such as AlGaN/GaN HEMTs. Since both GaN and AlGaN are very inert to wet chemical etchants, chlorine-based dry plasma etching is typically used to form gate recesses in AlGaN/GaN devices. There are, however, two major drawbacks to dry plasma etching: 1) it may cause plasma damage, creating a high density of defect states and degrading the channel mobility in the recessed region; and 2) due to variations in the plasma etch rate, it may be difficult to control the recess depth precisely by timed etching, which causes a variation in transistor parameters such as the transconductance ($g_m$) and threshold voltage ($V_{th}$). This problem becomes even more challenging when devices with different gate lengths are subjected to the same gate recess etching process, as the etching rates can be different for different transistor gate lengths and/or aspect ratios.

Described herein are semiconductor structures and processes for forming semiconductor structures that can reduce or eliminate plasma-induced damage and etch-based process variations. A recess etching fabrication technology is described which can precisely control the etching depth and produce an extremely low defect density on the recessed surface. In some embodiments, the semiconductor structures described herein may be formed of compound semiconductor material(s), such as III-V semiconductor material(s), particularly III-Nitride (III-N) semiconductor material(s). Using such techniques, high performance transistors can be fabricated, such as RF III-N and/or normally-off III-N power transistors, for example.

The techniques described herein can exploit etching selectivity between different semiconductor materials (e.g., different III-N semiconductor materials). For example, GaN can be selectively etched over materials such as AlN, AlGaN, InAlN and AlInGaN with high Al content using a dry etching technique. In some embodiments, a selective dry etching step followed by a wet etching step can be used to achieve precise control of recess depth and produce a surface with a low density of defect states. The wet etching step, if performed, may be selective or non-selective. If the wet etching step is selective, AlN, AlGaN, InAlN and AlInGaN with high Al content can be selectively etched over materials such as GaN, AlGaN, InGaN, and AlInGaN with low Al content using a wet etching technique. However, the techniques described herein are not limited as to a wet etching step.

Figure 1A:
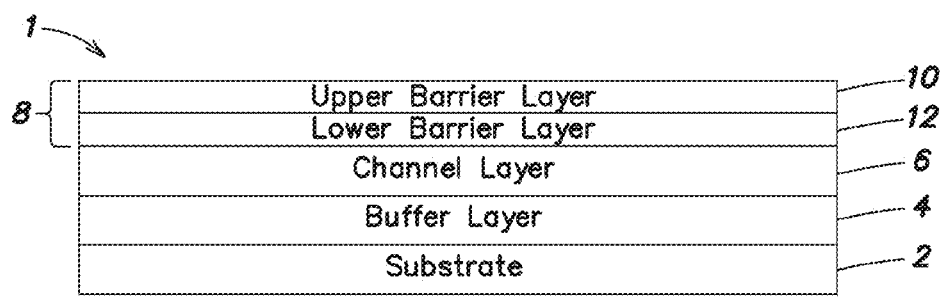
FIGS. 1A-1D show a semiconductor structure with a dual layer barrier structure and an etching process for forming a recess in the semiconductor structure, according to some embodiments.

FIG. 1A shows a semiconductor structure 1 on which an etching technique as described herein may be performed. Semiconductor structure 1 may include a substrate 2, a buffer layer 4, a channel layer 6, and a barrier layer 8. Barrier layer 8 includes an upper barrier layer 10 and a lower barrier layer 12. In some embodiments, the upper barrier layer 10 is formed of a material that is etchable by a first etching technique, such as dry etching, and the lower barrier layer 12 is formed of a material that is etchable by a second etching technique, such as wet etching. In this embodiment, the lower barrier layer 12 is substantially not etched by the first etching technique used to etch the upper barrier layer 10, thus forming an etch-stop. Examples of materials that may form the semiconductor structure 1 will now be described.

In some embodiments, a semiconductor material with a lattice constant different from that of the substrate 2 may be formed over the substrate 2. In some embodiments, a buffer layer 4 may be included between the substrate 2 and the overlying semiconductor material to accommodate a difference in lattice constant. The substrate 2 may include a group IV semiconductor material such as silicon or germanium, for example. The semiconductor material formed over the substrate 2 may include a compound semiconductor material, such as a III-V semiconductor material (e.g., a III-N material). Suitable techniques for accommodating a lattice mismatch between a substrate 2 and a semiconductor material of different lattice constant using a buffer layer 4 are understood by those of ordinary skill in the art, and will not be detailed herein. In some embodiments a substrate 2 having a suitable lattice constant for the formation of overlying compound semiconductor material(s) may be used, and buffer layer 4 may be omitted. For example, substrate 2 may be a GaN substrate, a ZnO substrate or another substrate of a material with a lattice constant similar to that of a compound semiconductor material to be formed thereon. The techniques described herein are not limited as to the substrate 2 or buffer layer 4.

The substrate 2 and the layer(s) of semiconductor material formed thereon may be monocrystalline, and may have any suitable crystallographic orientation. Compound semiconductor materials, if included in the substrate 2 or an overlying layer, may have any suitable composition at the face of the semiconductor material. If a III-N material is included, it may have an N-face composition or a group III face composition. For example, GaN may be grown either N-face and Ga-face or in non-polar orientations.

The channel layer 6 may be formed of a semiconductor material suitable for formation of a channel therein. In some embodiments, the channel layer 6 may include a MN semiconductor material, such as a III-N semiconductor material. In some embodiments, the channel layer 6 may include gallium nitride (GaN). In some embodiments, a nitride semiconductor material may be used such as $B_wAl_xIn_yGa_zN$, for example, in which w, x, y and z each have any suitable value between zero and one (inclusive), and w+x+y+z=1.

In some embodiments, a semiconductor heterostructure may be formed in the semiconductor structure 1. For example, in some embodiments a barrier layer 8 comprising $B_{w1}Al_{x1}In_{y1}Ga_{z1}N$ and a channel layer 6 comprising $B_{w2}Al_{x2}In_{y2}Ga_{z2}N$ may be formed, where a semiconductor material of the barrier layer 8 has a larger bandgap and/or polarization than that of the channel layer 6. However, the techniques described herein are not limited as to the formation of heterostructures.

As discussed above, in some embodiments a barrier layer 8 may be formed having two or more layers. For example, the barrier layer 8 may include a "dual-layer" barrier structure having an upper barrier layer 10 of a first semiconductor material that is etchable using a first etching technique and a lower barrier layer 12 of a second semiconductor material that is etchable using a second etching technique. In some embodiments, the upper barrier layer 10 may include a semiconductor material that is selectively etchable in a dry etching process, such as GaN, for example, or another nitride semiconductor material such as $B_wAl_xIn_yGa_zN$, for example, in which w, x, y and z each have any suitable value between zero and one (inclusive), and w+x+y+z=1, and the composition is such that the nitride semiconductor material is selectively etchable using a dry etching process. For example, the upper barrier layer 10 may include a semiconductor material such as $B_wAl_xIn_yGa_zN$ in which x is less than 0.25.

The upper barrier layer 10 may be doped or undoped. Doping the upper barrier layer 10 may supply carriers to the channel layer in the region(s) that are not under the gate. A doped region may be formed between the gate and the source and/or between the gate and the drain, outside of the gate-recess. If the upper barrier layer 10 includes a region that is doped, it may be polarization doped or may include dopants such as n-type dopants or p-type dopants. If the upper barrier layer 10 is doped, it may have any suitable doping concentration and distribution. For example, dopants may be provided at the lower surface of upper barrier layer 10, the upper surface of upper barrier layer 10, and/or in another location. The doping profile can be uniform or non-uniform. In some embodiments, a delta-doping profile may be used. If upper barrier layer 10 is doped, any suitable doping technique may be used, such as implantation or diffusion, for example. As another example, the upper barrier layer 10 may be doped during the formation (e.g., growth) of upper barrier layer 10. In some embodiments, the doping type of the upper barrier layer 10 may be of the same type as that of the carriers in the channel region. For example, the doping type in the upper barrier layer 10 may be n-type for an n-channel transistor and p-type for a p-channel transistor. In some embodiments, the doped region may be highly doped.

The lower barrier layer 12 may include a semiconductor material that is etchable using a wet etching technique, such as aluminum nitride (AlN), for example, or another material such as $B_wAl_xIn_yGa_zN$, for example, in which x, y and z each have any suitable value between zero and one (inclusive), and w+x+y+z=1, and the composition is such that the nitride semiconductor material is etchable using a wet etching process. For example, the lower barrier layer 12 may include a semiconductor material such as $B_wAl_xIn_yGa_zN$ in which x is greater than 0.5.

The reference herein to $B_wAl_xIn_yGa_zN$ or a "$B_wAl_xIn_yGa_zN$ material" refers to a semiconductor material having nitride and one or more of boron, aluminum, indium and gallium. Examples of $B_wAl_xIn_yGa_zN$ materials include GaN, AlN, AlGaN, AlInGaN, InGaN, and BAlInGaN, by way of illustration. A $B_wAl_xIn_yGa_zN$ material may include other materials besides nitride, boron, aluminum, indium and/or gallium. For example, a $B_wAl_xIn_yGa_zN$ material may be doped with a suitable dopant (e.g., silicon, germanium, etc.).

A process of forming a transistor in the semiconductor structure 1 of FIG. 1A using first and second etching techniques will be described with respect to FIGS. 1B-1D.

Figure 1B:
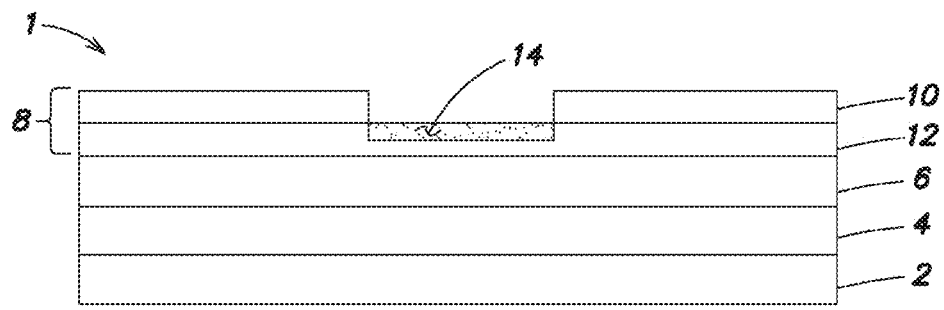

As shown in FIG. 1B, a first etching step may be performed using a first etching technique to remove a portion of the upper barrier layer 10. A suitable masking process may be used to define the region to be etched. The etching technique used in the first etching step may selectively etch the material of upper barrier layer 10 with respect to the material of the lower barrier layer 12. The selectivity of the etch process used in the first etching step may be greater than one, such that the upper barrier layer 10 is etched at a faster rate than the lower barrier layer 12. In some embodiments, the selectivity of the etch process used in the first etching step may be greater than 3:1, such that the upper barrier layer 10 is etched at a rate greater than three times as high as the rate at which the lower barrier layer 12 is etched.

As discussed above, the first etching technique may include a dry etching technique (e.g., dry plasma etching, also referred-to as reactive ion etching (RIE)). If the upper barrier layer includes GaN, a fluorine-based etching process may be used, for example. FIG. 1B shows the semiconductor structure 1 following the removal of a region of the upper barrier layer 10 using a dry etching process. The lower barrier layer 12 may serve as an etch stop to stop the dry etching process at its upper surface. The dry etching process may damage the upper surface of the lower barrier layer 12, creating a damaged region 14. However, in some embodiments the dry etching process may not produce any significant damage. In some embodiments, a damaged region 14 of the barrier layer 12 may be oxidized prior to removal of the damaged region 14 in a second etching step.

Figure 1C:
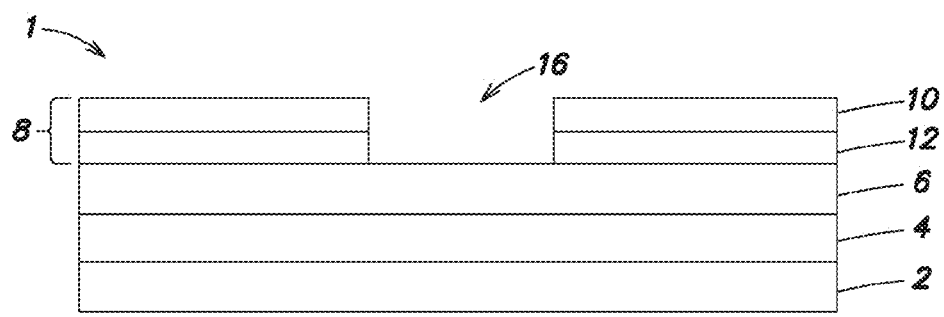

As shown in FIG. 1C, a second etching step may be performed using a second etching technique to remove a portion of the lower barrier layer 12. However, the second etching step is optional, and is not required be performed.

If the second etching step is performed, a portion of the lower barrier 12 may be removed in a window formed by removal of a region of the upper barrier layer 10 in the first etching step. In some embodiments, the etch process used in the second etching step may selectively etch the lower barrier layer 12 with respect to a layer overlying the lower barrier layer 12 and which may be in contact with the lower barrier layer 12, such as the upper barrier layer 10, for example. In some embodiments, the etch process used in the second etching step may selectively etch the lower barrier layer 12 with respect to a layer below the lower barrier layer 12 which may be in contact with the lower barrier layer 12, such as the channel layer 6 and/or a band offset layer. The selectivity of the etching of the lower barrier layer 12 with respect to the upper barrier layer 10 and/or the channel layer 6 may be greater than one, such that the rate of etching of the lower barrier layer 12 is greater than that of the upper barrier layer 10 and/or channel layer 6. In some embodiments, the selectivity may be greater than 3:1, such that the lower barrier layer 12 is etched at a rate greater than three times as high as the upper barrier layer 10 and/or the channel layer 6. However, the second etching step is not required to be selective, and in some embodiments may not selectively etch the lower barrier layer 12 with respect to the upper barrier layer 10 or the channel layer 6.

As discussed above, the etching technique used in the second etching step may be a wet etching technique. FIG. 1C shows the semiconductor structure 1 following the removal of a region of the lower barrier layer 12 using a wet etching process. The wet etching process may remove the damaged region 14, and may enable forming a gate recess 16 without a damaged region at its lower surface. The wet etching process may remove the entire thickness of the lower barrier layer 12, as shown in FIG. 1C, or a portion of the thickness of the lower barrier layer 12. In some embodiments, the use of a wet etching process to etch the lower barrier layer 12 may provide fine control over the depth of the gate recess 16 and reduce or eliminate process-induced variations in transistor characteristics.

Figure 1D:
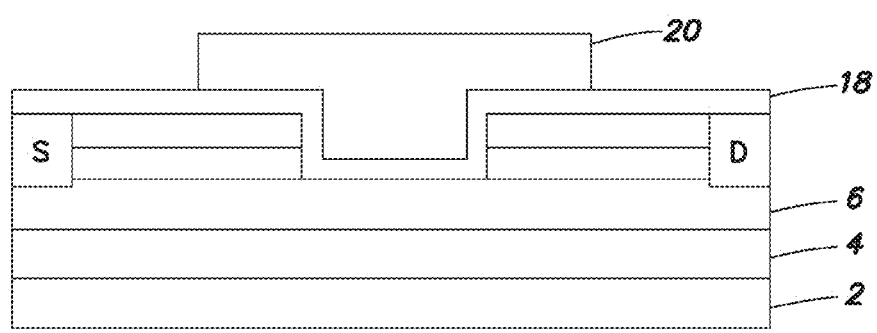

As shown in FIG. 1D, a gate dielectric 18 and a gate 20 may be formed in the gate recess 16. Any suitable materials may be used for the gate dielectric and gate 20. The gate dielectric may be formed of any suitable insulator. The gate 20 may be formed any suitable conductor or semiconductor, such as a metal or polysilicon. Source and drain regions S, D can also be formed, as understood by those of ordinary skill in the art. The source and/or drain regions S, D may be formed of a suitable conductor or semiconductor, such as a metal and/or a doped semiconductor region. The source and/or drain regions S, D may have ohmic contacts.

In some embodiments, the upper barrier layer 10 may be selectively etched over the lower barrier layer 12 in the source and/or drain region(s). The lower barrier layer 12 may be wet etched in the source and/or drain regions(s) so that an ohmic metallization can be formed on the remaining barrier layer in the source and/or drain regions(s). The dry and/or wet etching of upper barrier layer 10 and/or lower barrier layer 12, respectively, to form the source and/or drain region(s) may be performed in the same etching process(es) used to form the gate recess, in some embodiments, or in a different process.

In some embodiments, the portion of the barrier layer 8 remaining after formation of the gate recess may have a thickness smaller than a critical thickness to prevent the formation of a two dimensional electron gas (2DEG) under the gate (see FIG. 5B, for example), thereby forming a normally-off transistor. However, the techniques described herein are not limited to formation of normally-off transistors, and may be used to form other devices, such as normally-on transistors.

The operation of normally-on and normally-off transistors is summarized as follows. When a normally-off transistor has no voltage applied to the gate, the transistor is in the off-state and is substantially non-conducting. When a suitable voltage is applied to the gate, a normally-off transistor is in the on-state and carriers can flow between its main conduction terminals (e.g., source and drain). When a normally-on transistor has no voltage applied to the gate, the transistor is in the on-state and carriers can flow between its main conduction terminals (e.g., source and drain). When a normally-on transistor has a suitable voltage applied to the gate, the normally-on transistor is in the off-state and is substantially non-conducting.

In some embodiments, carriers may be supplied to the channel layer 6 by a layer different from the upper barrier layer 10. FIGS. 2A-2D illustrate an embodiment in which a carrier donor layer 22 is included in the semiconductor structure. In the embodiment of FIGS. 2A-2D, the carrier donor layer 22 is formed over the upper barrier layer 10. However, the techniques described herein are not limited in this respect, as the carrier donor layer 22 may be formed below the upper barrier layer 10 or in another location. In some embodiments, carrier donor layer 22 may be formed of the same material as that of the upper barrier layer 10.

Carrier donor layer 22 may supply carriers to the channel layer outside of the region under the gate. Carrier donor layer 22, if included, may be doped using any suitable doping technique such as those discussed above with respect to the optional doping of upper barrier layer 10. A doped region may be formed in the carrier donor layer 22 between the gate and the source and/or between the gate and the drain, outside of the gate-recess. Doping the carrier donor layer 22 may supply carriers to the channel layer in the region(s) that are not under the gate. The doped region may be polarization doped or may include dopants such as n-type dopants or p-type dopants. It may have any suitable doping concentration and distribution. For example, dopants may be provided at the lower surface of the carrier donor layer 22, the upper surface of the carrier donor layer 22, and/or in another location. The doping profile can be uniform or non-uniform. In some embodiments, a delta-doping profile may be used. Any suitable doping technique may be used, such as implantation or diffusion, for example. As another example, the carrier donor layer 22 may be doped during the formation (e.g., growth) of the carrier donor layer 22. In some embodiments, the doping type of the carrier donor layer 22 may be of the same type as that of the carriers in the channel region. For example, the doping type in the carrier donor layer 22 may be n-type for an n-channel transistor and p-type for a p-channel transistor. In some embodiments, the doped region may be highly doped. If a carrier donor layer 22 is included, in some embodiments the upper barrier layer 10 may not be doped.

In some embodiments, the carrier donor layer 22 may be formed of a semiconductor material that is etchable by a dry etching process. The carrier donor layer 22 may include a compound semiconductor such as a III-V semiconductor material, e.g., a semiconductor material, such as $B_wAl_xIn_yGa_zN$, for example, in which w, x, y and z each have any suitable value between zero and one (inclusive), and w+x+y+z=1, and the composition is such that the III-N semiconductor material is etchable using a dry etching process. As shown in FIGS. 2A-2D, a barrier layer 28 may include the carrier donor layer 22, the upper barrier layer 10 and the lower barrier layer 12.

In some embodiments, the carrier donor layer 22 may shape the electric field in the semiconductor structure (e.g., in the channel region). The doping density may be tuned as needed to shape the electric field. In some embodiments, the carrier donor layer 22 may be used as a passivation layer. Carrier donor layer 22 may have any suitable thickness. In some embodiments, the thickness of carrier donor layer may be greater than 5 nm.

Figure 2A:
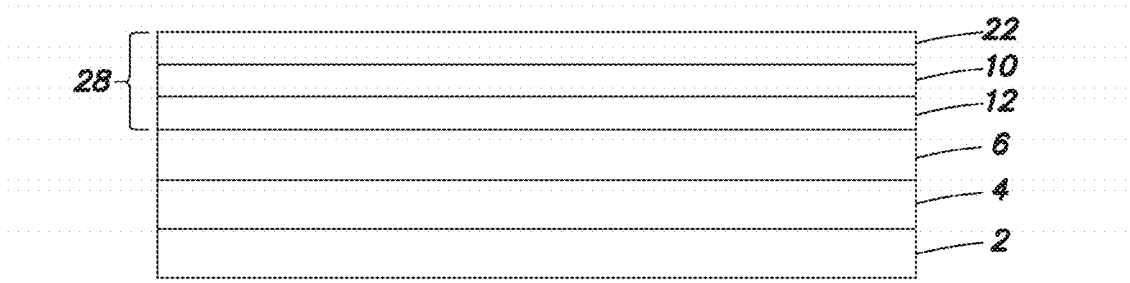
FIGS. 2A-2D show a semiconductor structure with a carrier donor layer and an etching process for forming a recess in the semiconductor structure, according to some embodiments.
Figure 2B:
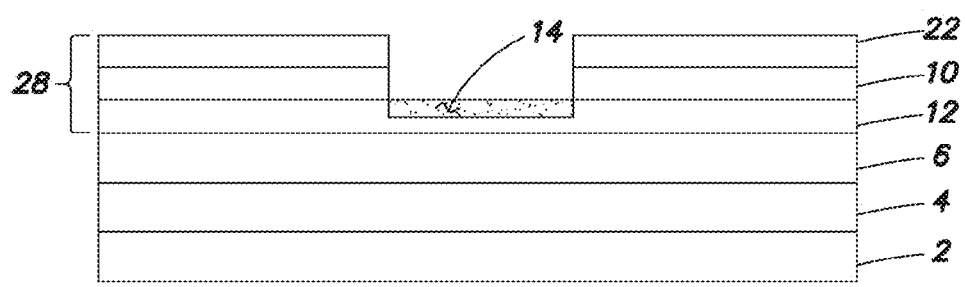
Figure 2C:
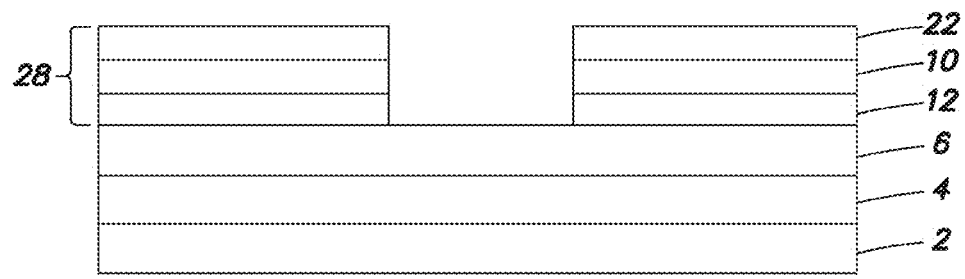
Figure 2D:
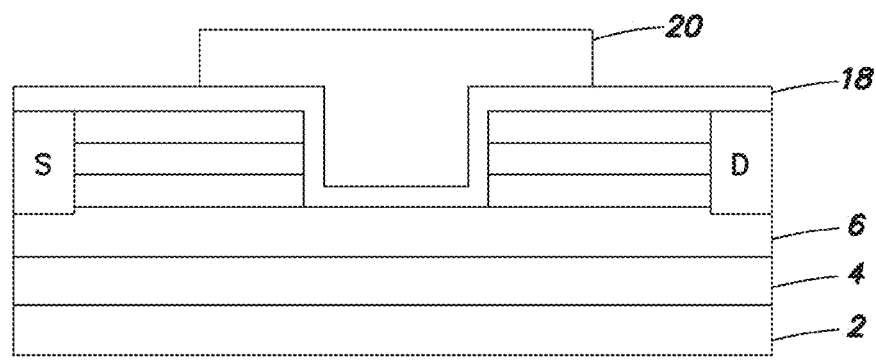

As shown in FIG. 2B, a first etching process, such as a dry etching process, may be used to etch away regions of carrier donor layer 22 and the upper barrier layer 10. A region of the lower barrier layer 12 may be removed using a wet etching process, as illustrated in FIG. 2C. A gate dielectric 18 and gate 20 may be formed in the gate recess, as illustrated in FIG. 2D. Source and drain regions S, D of the transistor may be formed.

In some embodiments, a semiconductor structure may include a band offset layer 32 between the channel layer 6 and the lower barrier layer 12. The band offset layer 32 may increase the band offset between the barrier layer 38 and the channel layer 6. As shown in FIGS. 3A-3D, a barrier layer 38 may include the upper barrier layer 10, the lower barrier layer 12 and a band offset layer 32.

Figure 3A:
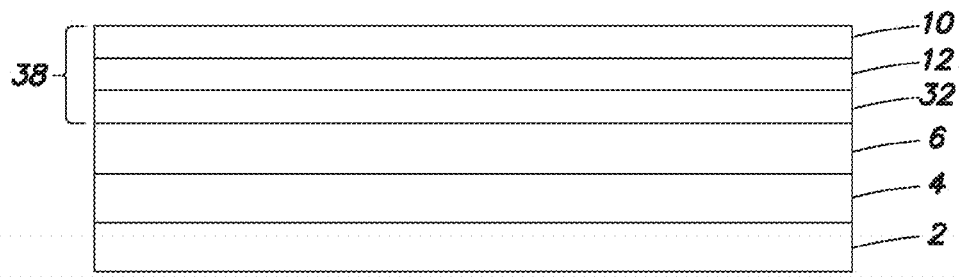
FIGS. 3A-3D show a semiconductor structure with a band offset layer and an etching process for forming a recess in the semiconductor structure, according to some embodiments.
Figure 3B:
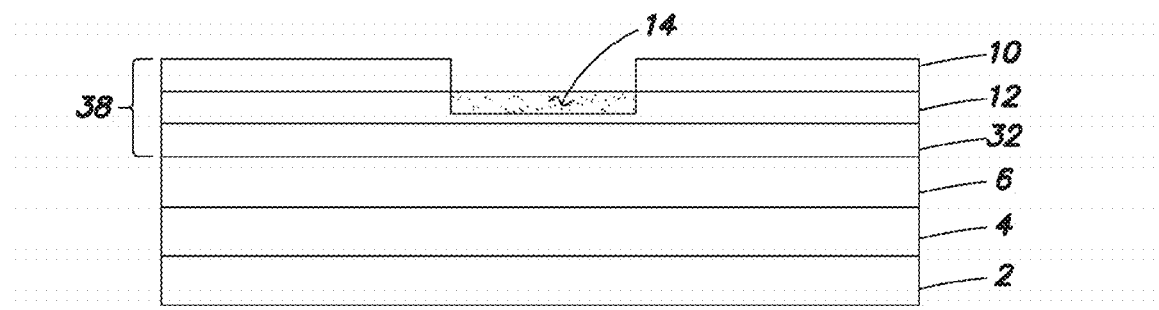
Figure 3C:
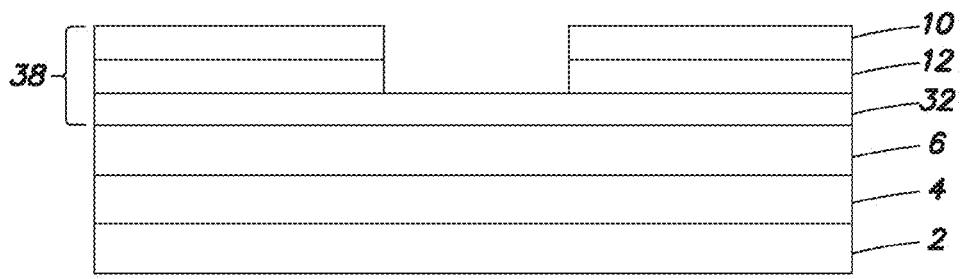
Figure 3D:
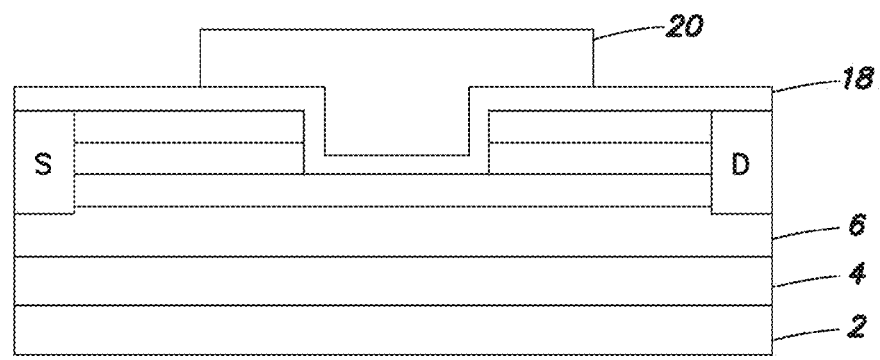

As shown in FIG. 3B, a first etching process, such as a dry etching process, may be used to etch away a region of the upper barrier layer 10. A region of the lower barrier layer 12 may then be removed using a wet etching process, as illustrated in FIG. 3C. In some embodiments, the band offset layer 32 may be very thin, with a thickness below a critical thickness so as to produce a normally-off transistor when a gate is formed over the band-off set layer 32. In some embodiments, the band offset layer 32 may be thicker than the critical thickness. When the band offset layer 32 is thicker than the critical thickness, a normally-off transistor may be produced by removing at least a portion of the band offset layer 32 using the wet etching process such that the remaining portion has a thickness below the critical thickness. A gate dielectric 18 and gate 20 may be formed in the gate recess, as illustrated in FIG. 2D. Source and drain regions S, D of the transistor may be formed. Optionally, an embodiment as illustrated in FIG. 3A-3D may include a carrier donor layer 22 (not shown in FIGS. 3A-3D).

Figure 4:
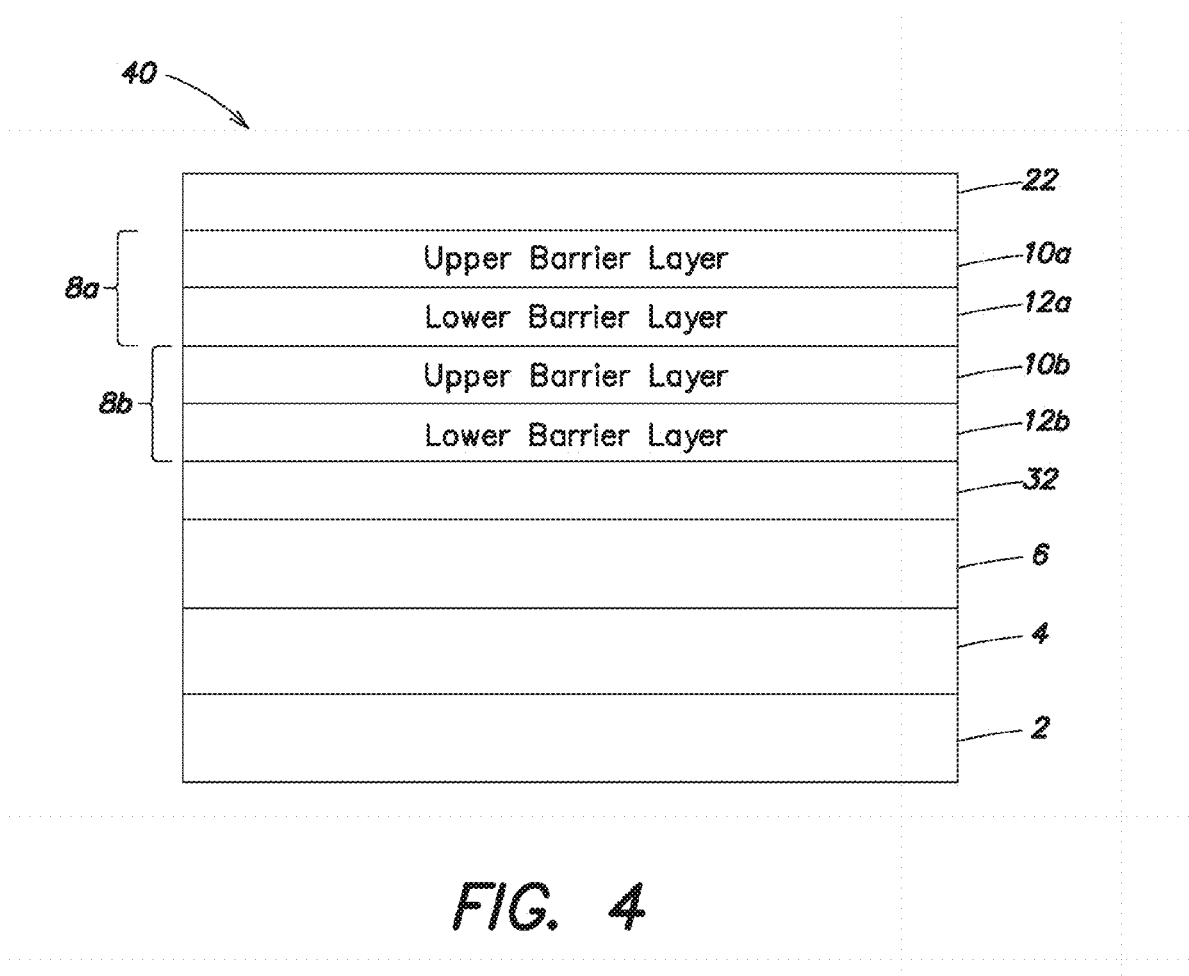
FIG. 4 shows a semiconductor structure with a plurality of dual layer barrier structures, according to some embodiments.

In some embodiments, a semiconductor structure may include a plurality of "dual-layer" barrier structures. Any suitable number of "dual-layer" barrier structures may be included. For example, as illustrated in FIG. 4, a semiconductor structure 40 may include a first dual-layer barrier structure 8a and a second dual-layer barrier structure 8b, each having a upper barrier layer 10 and a lower barrier layer 12. The upper and lower barrier layers are indicated in FIGS. 4 as 10a and 12a, respectively, for dual-layer barrier structure 8a, and indicated as 10b and 12b, respectively, for dual-layer barrier structure 8b. Dual-layer barrier structures 8a and 8b may have the same structure and/or composition, or a different structure and/or composition. To form a recess, e.g., a gate recess, a first etching process (e.g., a dry etching process) may be performed to remove a region of layer 10a, then a second etching process (e.g., a wet etching process) may be performed to remove a region of layer 12a. Then, the first etching process (e.g., a dry etching process) may be performed to remove a region of layer 10b, and then a second etching process (e.g., a wet etching process) may be performed to remove a region of layer 12b. A gate dielectric 18 and gate 20 may be formed in the gate recess, as discussed above. Source and drain regions S, D of the transistor may be formed. A band-offset layer 32 and/or a carrier donor layer 22 may be included in the semiconductor structure 40. However, the techniques described herein are not limited in this respect, as a band-offset layer 32 and carrier donor layer 22 are optional.

Described herein are techniques for forming a recess that may be applied to forming a gate-recess of a transistor. Such techniques may be applied to any suitable type of transistor, including any type of field effect transistor such as MISFETs (Metal-Insulator Semiconductor Field Effect Transistor), and MESFETs (Metal-Semiconductor Field Effect Transistor) for example.

The techniques described herein are not limited to techniques for forming a gate-recess. Such techniques may be used any other application where a damage-free, uniform and/or reproducible etch is desired, for example. One example is formation of an ohmic recess to reduce the ohmic contact resistance and/or to form gold-free ohmic contact. Another example is the formation of one or more recesses to access the n-doped layer in a GaN light emitting diode or laser. A further example is the formation of one or more recesses to access the base and/or collector layers in a III-N bipolar transistor.

A non-limiting example is described below which includes experimental results of transistors with gate recesses produced according to at least some of the techniques described herein.

EXAMPLE

In an exemplary embodiment, the upper barrier layer 10 may be formed of GaN, and the lower barrier layer 12 may be formed of AlN. The GaN can be selectively etched over the AlN by fluorine-based dry etching. The AlN can be selectively etched over GaN by a wet etching process with a base such as potassium hydroxide (KOH) and/or tetramethylammonium hydroxide (TMAH), or by a digital etching process. Digital etching processes are understood by those of ordinary skill in the art and will not be detailed herein. However, these are only examples, and any suitable etchants may be used.

Figure 5A:
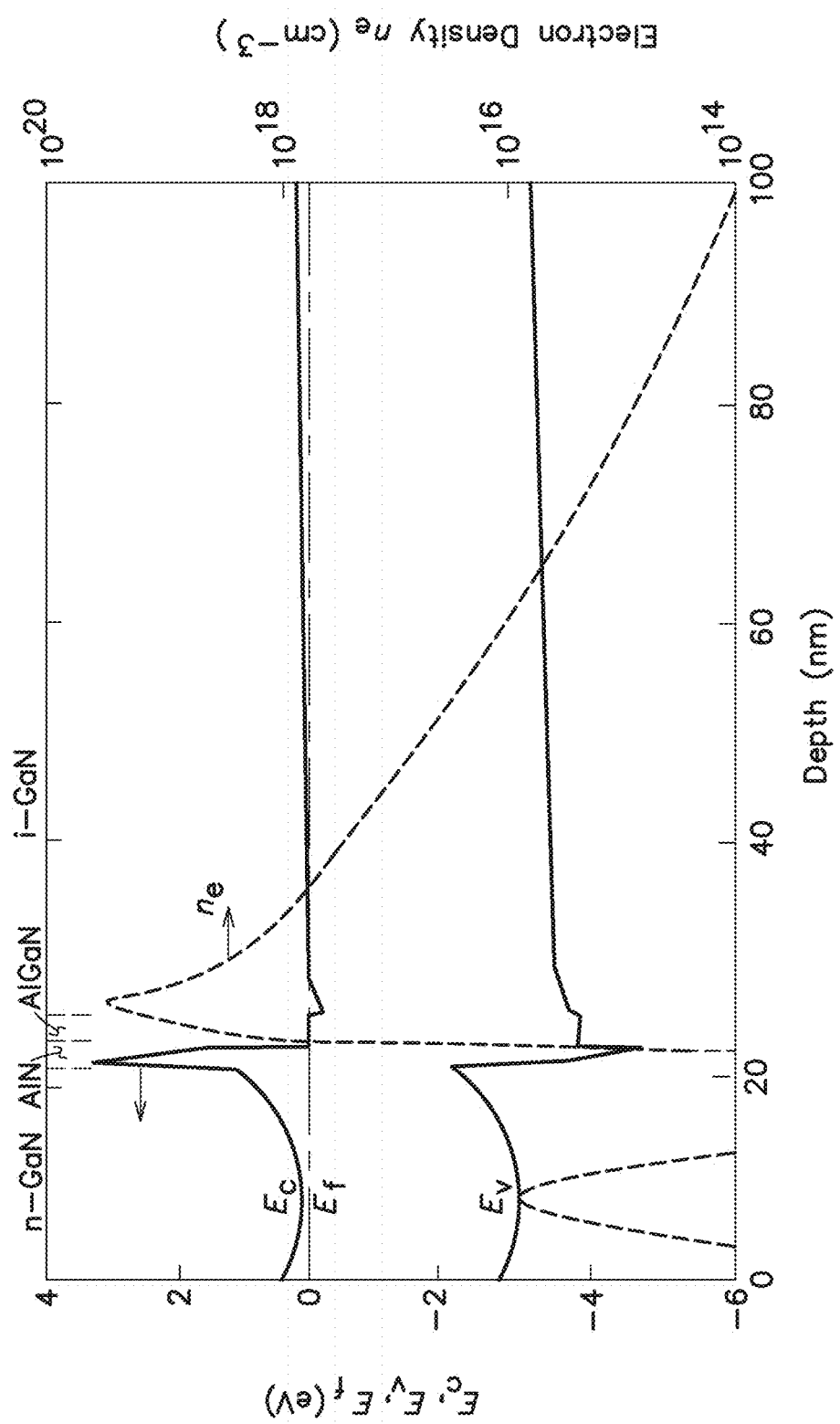
FIG. 5A shows the band structure and electron density versus position for an exemplary transistor.
Figure 5B:
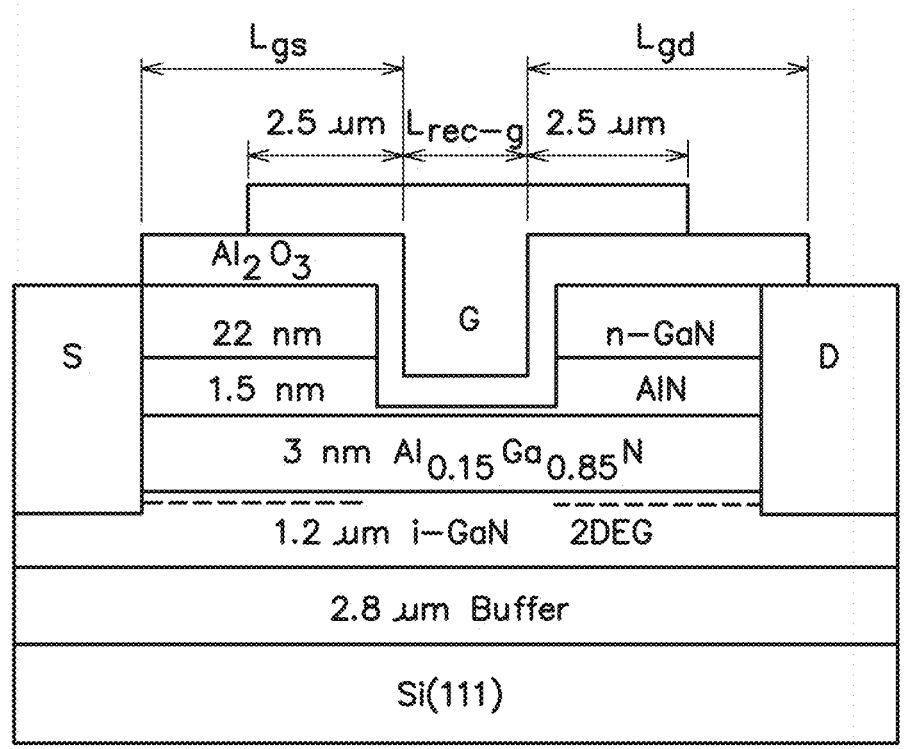
FIG. 5B shows the structure of an exemplary transistor, according to some embodiments.
Figure 6A:
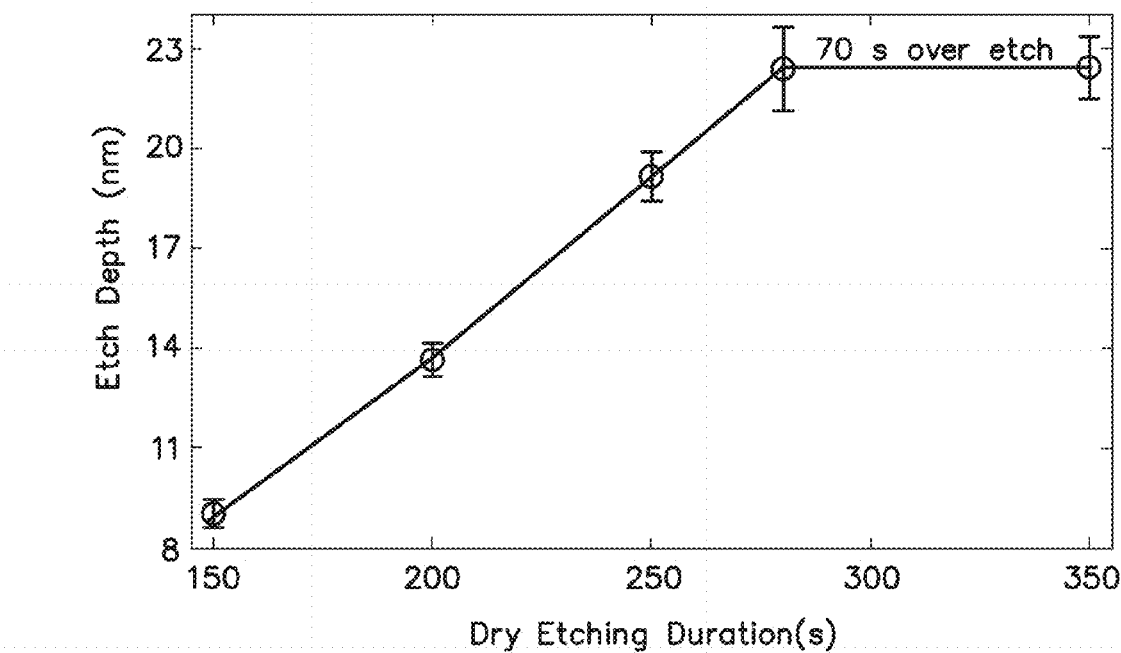
FIG. 6A shows a plot of the etch depth as a function of etch duration.
Figure 6B:
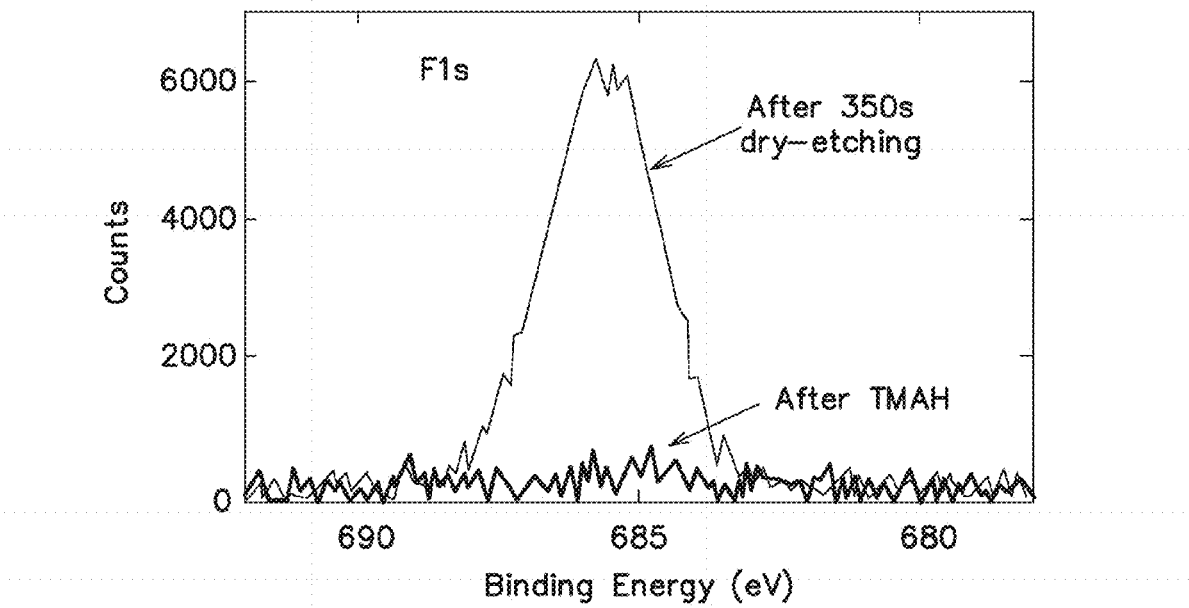
FIG. 6B shows a plot of an XPS F1s signal of a sample dry etched for 350 seconds and subsequently wet etched by TMAH.

FIG. 5A shows a plot showing the band structure and electron density versus position for an exemplary transistor. FIG. 5B shows the structure of an exemplary transistor, according to some embodiments. Exemplary devices have been fabricated having the structure shown in FIG. 5B. The structure was grown on a 4 inch silicon substrate by metal-organic chemical vapor deposition. The structure includes a 22 nm GaN:Si cap layer with 3-6×10$^{18}$ cm$^{-3}$ Si doping/1.5 nm AlN/3 nm Al$_{0.15}$Ga$_{0.85}$N/1.2-μm i-GaN/2.8-μm buffer/p-type Si(111) substrate. Hall measurement shows a sheet resistance of 579±11 Ω/sq and two-dimensional-electron-gas (2DEG) mobility of 1529±18 cm$^2$·V$^{-1}$·s$^{-1}$ with a sheet charge density of 7.1±0.1×10$^{12}$ cm$^{-2}$. The device fabrication started with mesa isolation and Ti/Al/Ni/Au ohmic contact formation which was annealed at 870° C. for 30 s. To fabricate the recessed-gate transistors, the n-GaN cap in the recessed-gate region was selectively etched over the AlN layer by fluorine-based electron-cyclotron-resonance reactive ion etching (ECR-RIE). Due to the non-volatility of aluminum fluoride (AlF$_3$), very high etch selectivity of GaN over AlN is achieved for the gas flow rates of 5 sccm BCl$_3$/35 sccm SF$_6$ at 35 mtorr, 100 W ECR power and 100 V DC bias. A 350 second etch with 70 second over-etching was used to achieve uniform and complete removal of the n-GaN layer, as shown in FIG. 6A, where the recess depth was measured by an atomic force microscope. The surface of the AlN layer was then oxidized by low-energy oxygen plasma and wet etched by a 1-min dip in tetramethylammonium hydroxide (TMAH) at room temperature to remove the dry etching damage. The presence of fluorine from the dry-etch step was significantly reduced after the TMAH wet etch, as shown in the X-ray photoelectron spectroscopy (XPS) measurement in FIG. 6B. After UV ozone and HCl surface cleaning, a 10-nm Al$_2$O$_3$ gate dielectric was then deposited by atomic layer deposition at 250° C. and annealed at 500° C. for 1 min in forming gas. A Ni/Au gate electrode was deposited covering the recessed-gate region with a 2.5-μm overhang length, as shown in FIG. 5B. The sample was then annealed in forming gas at 400° C. for 5 min to reduce the positive fixed charge in Al$_2$O$_3$. The recessed-gate transistors have a recessed-gate length L$_{rec-g}$ varying from 3 to 20 μm.

Figure 7:
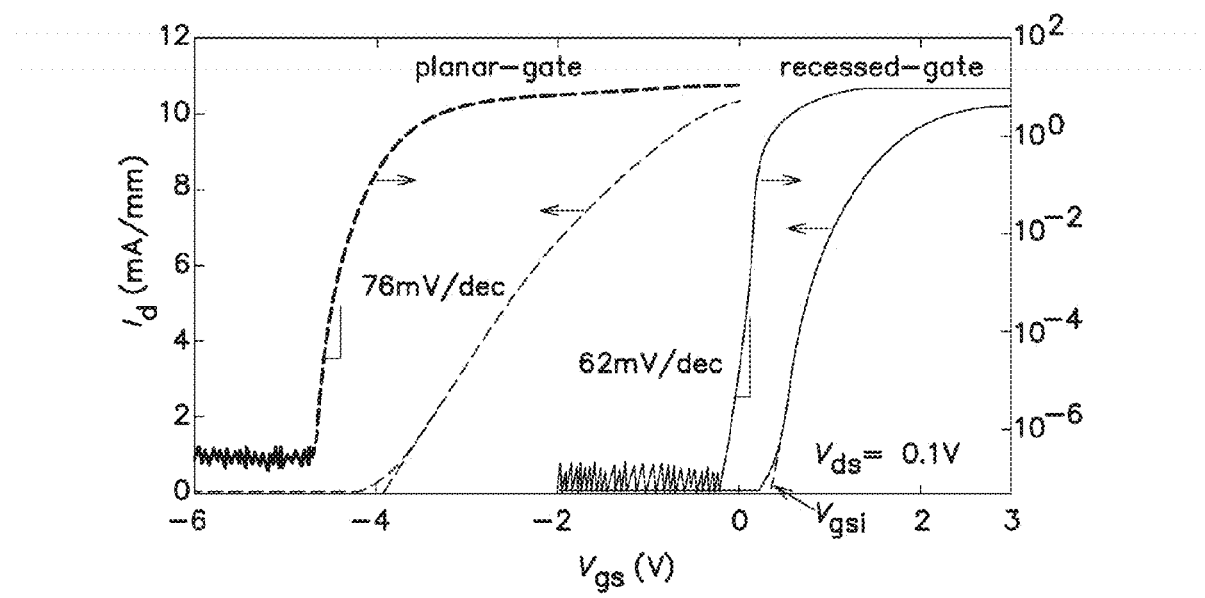
FIG. 7 shows a plot of $I_d$-$V_{gs}$, characteristics at Vds=0.1 V with a bidirectional gate sweep.
Figure 8:
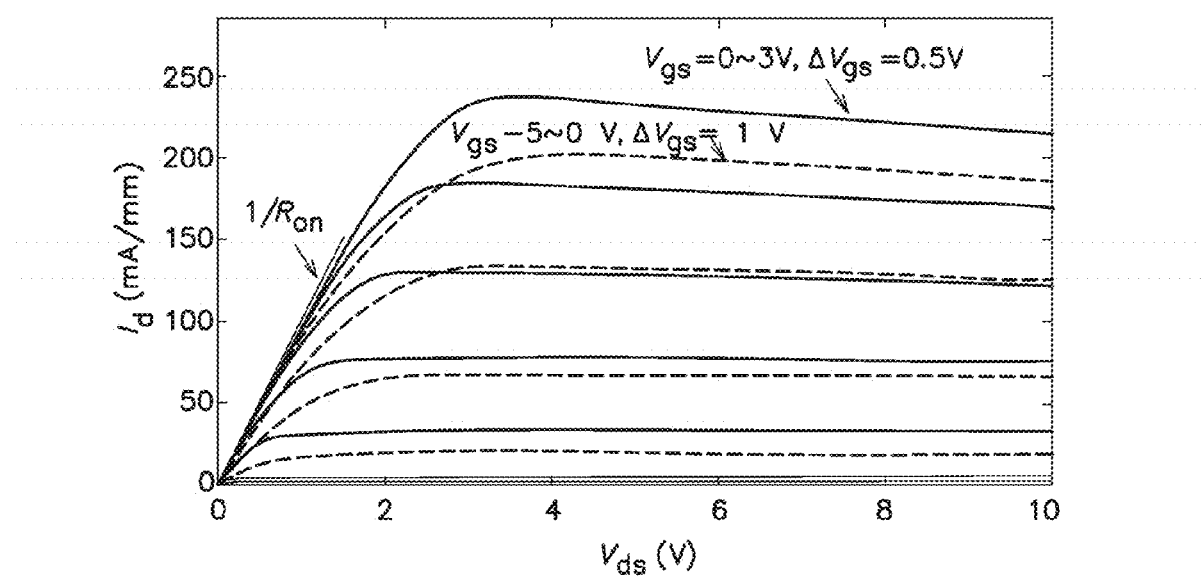
FIG. 8 shows a plot of $I_d$-$V_{ds}$ characteristics for a recessed-gate transistor and a planar-gate transistor. The recessed-gate transistor (solid lines) has $L_{rec-g}$=3 μm and $L_{gs}$=$L_{gd}$=4 μm. The planar-gate transistor (dashed lines) has the same $L_{sd}$ with $L_g$=8 μm and $L_{gs}$=$L_{gd}$=1.5 μm.

The dc (direct current) characteristics of the recessed-gate GaN MISFET are shown in FIGS. 7 and 8. Device threshold voltage V$_{th}$ is defined as V$_{th}$=V$_{gsi}$−0.5 V$_{ds}$, where V$_{gsi}$ is the interception voltage from the linear extrapolation of the I$_d$-V$_{gs}$ curve, as shown in FIG. 7. A small drain voltage (V$_{ds}$=0.1 V) was applied to place the device in a linear operation region. Averaging over 13 devices, the recessed-gate GaN MISFETs have a uniform V$_{th}$ of 0.30±0.04 V. The average subthreshold slope is 62±1 mV/decade. The bidirectional gate voltage sweep in the transfer characteristics in FIG. 7 shows less than 10 mV hysteresis in the threshold voltage. The recessed-gate transistor (solid lines) has a similar ON-resistance (R$_{on}$=10 Ω·mm) as a planar gate transistor (dashed lines) with the same source-to-drain distance (Lsd=11 μm), as shown in FIG. 8. The relatively low maximum drain current of both devices is due to the large gate length and gate-to-source distance, relatively low 2DEG density ($7.1 \times 10^{12}$ cm-2), and high contact resistance (1.2 Ω·mm) of the non-optimized ohmic contact.

Figure 9:
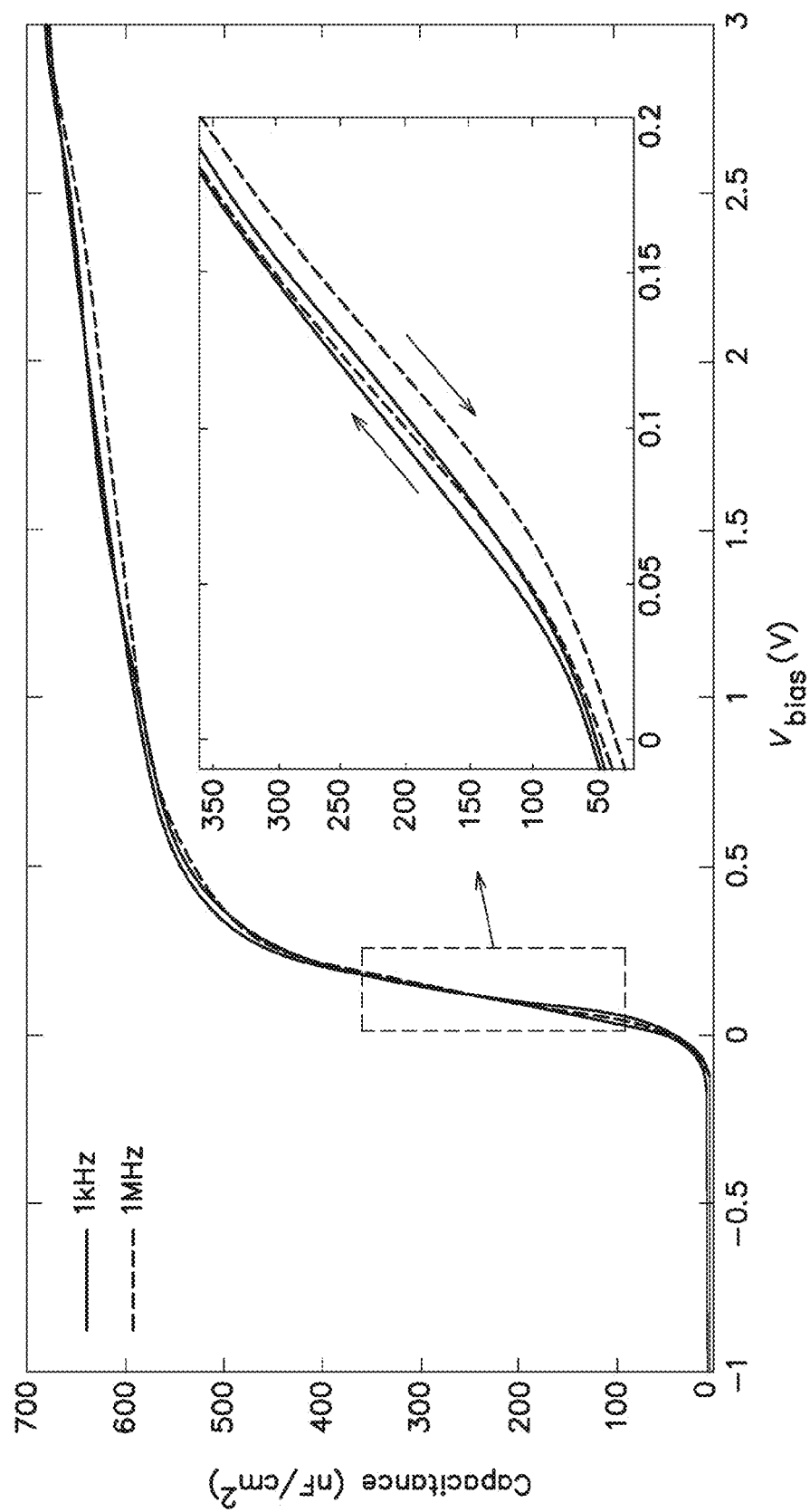
FIG. 9 shows a plot of the C-V characteristics of a recessed-gate capacitor measured at 1 kHz (solid line) and 1 MHz (dashed line) with bidirectional sweeps. The inset shows the dashed rectangular region.

Capacitance-voltage (C-V) characteristics (see FIG. 9) were measured on recessed-gate capacitors after subtracting the parasitic capacitance from the gate-2DEG overlapping region (see FIG. 5B). The C-V characteristics have low frequency dispersion between 1 kHz and 1 MHz and small hysteresis under bidirectional C-V sweeps, which indicate very low dielectric/semiconductor interface trap density in the recessed-gate region.

The effective channel electron mobility of the GaN normally-off MISFETs, i.e., $\mu_e$, as a function of gate-to-source voltage $V_{gs}$ can be extracted from $\mu_e = 1/(qN_{sh}R_{ch})$, where q is the electron charge ($1.6 \times 10$-19 C), $R_{ch}$ is the channel sheet resistance, and $N_{sh}$ is the channel accumulation charge density (in cm$^{-2}$). $R_{ch}$ was extracted from the slope of the $R_{on}$ versus $L_{rec-g}$ curves in FIG. 10. $N_{sh}$ was extracted by integrating the 1-MHz C-V characteristic in FIG. 9. $R_{ch}$, $N_{sh}$, and $\mu_e$ are summarized in Table 1 along with the gated-Hall measurement data from the recessed-gate Hall structure. The extracted $R_{ch}$ from the dc characteristics agrees with the gated-Hall measurement. The extracted $N_{sh}$ from the C-V measurement is larger than the gated-Hall measurement, and the difference grows as $V_{gs}$ increases. This is because at higher $V_{gs}$, an increasing quantify of the channel electrons overcomes the AlGaN barrier and accumulates at the gate dielectric/semiconductor interface.

ADDITIONAL ASPECTS

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. For example, an apparatus, structure, device, layer, or region recited as "including," "comprising," or "having," "containing," "involving," a particular material is meant to encompass at

TABLE I

CHANNEL RESISTANCE Rch (Ω/sq), CHARGE DENSITY Nsh(×1012 cm–2), AND ELECTRON MOBILITY µe (cm2 · V–1 · s–1) AS A FUNCTION OF Vgs (V) EXTRACTED FROM DC/C-V MEASUREMENTS AND GATED-HALL MEASUREMENT. Rch IS TOO LARGE AT Vgs = 1 V TO GIVE A RELIABLE HALL MEASUREMENT

| | $R_{ch}$ | | $N_{sh}$ | | $\mu_e$ | |
|---|---|---|---|---|---|---|
| $V_{gs}$ | DC | Hall | CV | hall | effective | Hall |
| 1 | 2367 ± 126 | — | 2.90 ± 0.11 | — | 911 ± 60 | — |
| 1.5 | 1195 ± 60 | 1114 ± 134 | 4.75 ± 0.11 | 4.2 ± 0.4 | 1100 ± 61 | 1336 ± 205 |
| 2 | 829 ± 81 | 783 ± 56 | 6.67 ± 0.11 | 5.8 ± 0.4 | 1131 ± 112 | 1376 ± 137 |
| 2.5 | 695 ± 87 | 679 ± 20 | 8.65 ± 0.11 | 7.1 ± 0.3 | 1040 ± 131 | 1296 ± 67 |
| 3 | 677 ± 90 | 683 ± 11 | 10.71 ± 0.13 | 8.2 ± 0.3 | 862 ± 115 | 1116 ± 45 |

Figure 10:
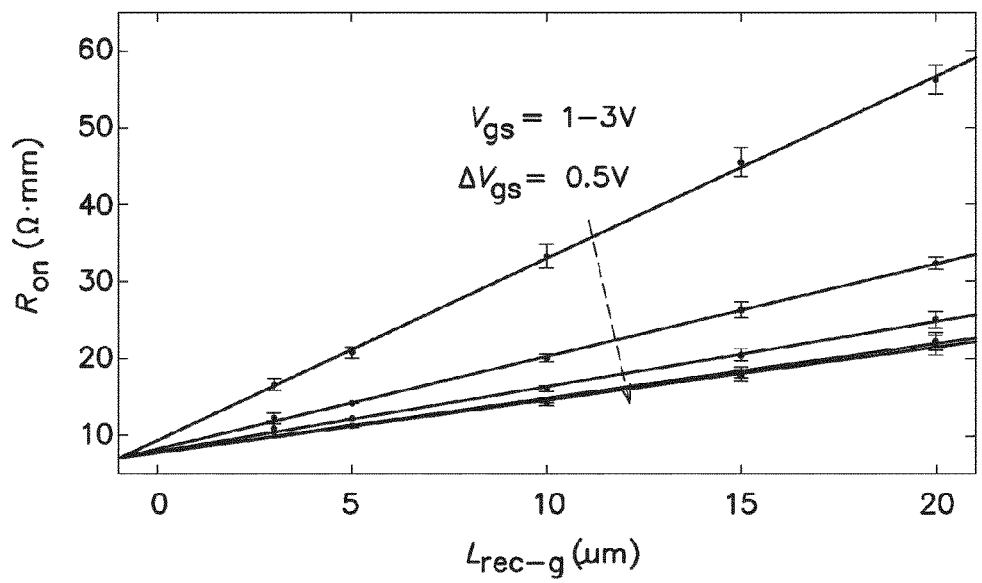
FIG. 10 shows a plot $R_{on}$, as function $L_{rec-g}$ at $V_{gs}$=1 to 3 V. The slope of each curve gives $R_{ch}$.
Figure 11:
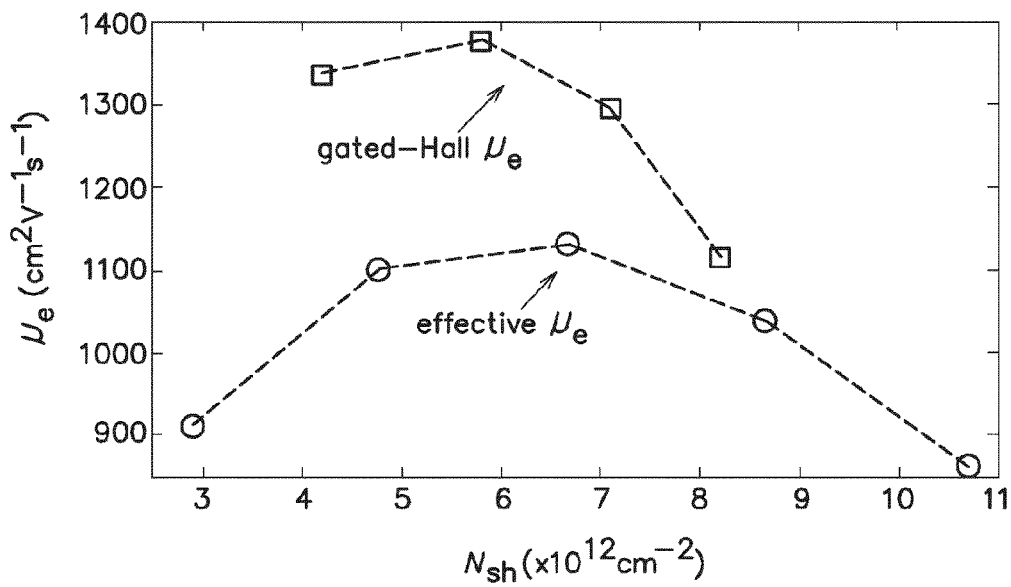
FIG. 11 shows a plot of effective $\mu_e$ and gated-Hall $\mu_e$ as a function of $N_{sh}$ of a recessed-gate GaN MISFET.

Since these electrons have low mobility due to alloy scattering and gate dielectric interface roughness scattering, they contribute little to the channel current and make no change to $R_{on}$ even at high gate voltages (see FIG. 10). Therefore, the gated-Hall measurement only measures the 2DEG at the AlGaN/GaN interface, which has lower $N_{sh}$ than the value extracted from the C-V characteristics. As shown in FIG. 11, the increase in $\mu_e$ at low $N_{sh}$ is due to the screening of ionized impurities and dislocations, and the decrease in $\mu_e$ at high $N_{sh}$ is due to increasing alloy scattering and interface roughness scattering. The maximum effective mobility is 1131 cm$^2 \cdot$V$^{-1} \cdot$s$^{-1}$, which is greatly improved compared with the previously-reported results on normally off GaN MISFETs.

Figure 12:
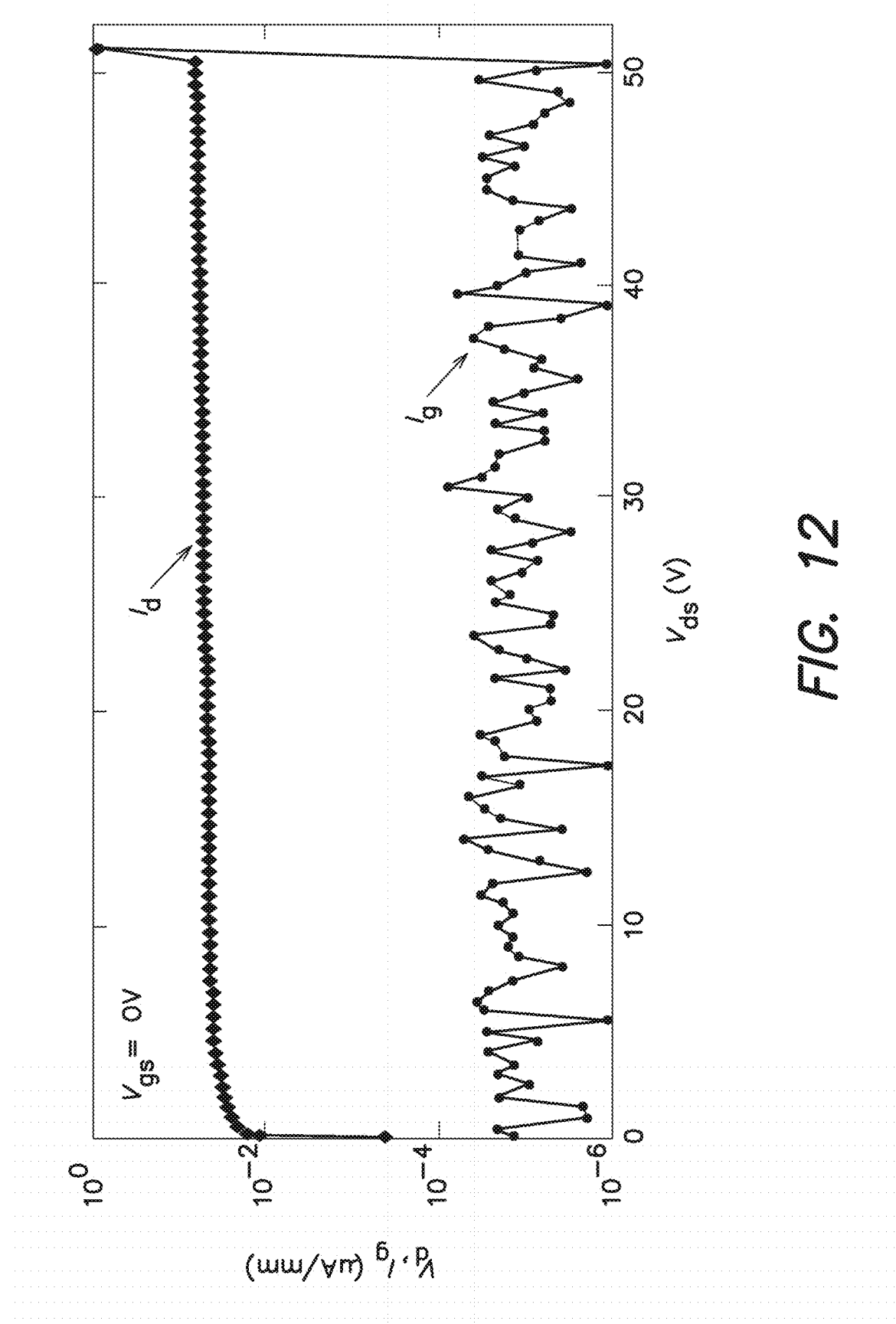
FIG. 12 shows a three-terminal BV measurement of a recessed-gate normally-off GaN MISFET with $L_{rec-g}$=3 μm, $L_{gd}$=μm at $V_{gs}$=0 V.

Three terminal breakdown voltage (BV) was measured on a recessed-gate GaN MISFET with $V_{gs}=0$ V and $L_{rec-g}=3$ µm and $L_{gd}=8$ µm. The drain leakage current is 68 nA/mm before the breakdown of the gate dielectric (at the drain side of the gate) at drain voltage of 50 V, as shown in FIG. 12.

least the material listed and any other elements or materials that may be present. The partially open-ended phrase "consisting essentially of" is meant to encompass essentially the material listed and does not preclude the presence of relatively small quantities of other materials, including the presence of dopants.

What is claimed is:
1. A transistor, comprising:
a channel layer; and
a barrier layer comprising a first layer including first semiconductor material and a second layer including a second semiconductor material, wherein the first layer is disposed over the second layer, wherein the first semiconductor material is selectively etchable over the second semiconductor material using a dry etching process, and
wherein a gate recess is disposed at least in the first layer; and
a gate disposed in the gate recess, wherein the first semiconductor material comprises a first III-N semiconductor material and the second semiconductor material comprises a second III-N semiconductor material, and wherein the first semiconductor material comprises a $B_wAl_xIn_yGa_zN$ material in which x is less than 0.25 and the second semiconductor material comprises a $B_wAl_xIn_yGa_zN$ material in which x is greater than 0.5.

2. The transistor of claim 1, wherein the second semiconductor material is selectively etchable with respect to a layer above and/or below the second layer using a wet etching process.

3. The transistor of claim 1, wherein the gate recess is further disposed in the second layer.

4. The transistor of claim 1, wherein the first semiconductor material comprises GaN and the second semiconductor material comprises AlN.

5. The transistor of claim 1, further comprising a doped region to provide carriers to the channel layer.

6. The transistor of claim 5, wherein the doped region is polarization doped, includes n-type dopants or includes p-type dopants.

7. The transistor of claim 5, wherein the doped region is in the first layer and/or in a carrier donor layer above and/or below the first layer, wherein the doped region is outside of the gate recess and between the gate and a source of the transistor and/or between the gate and a drain of the transistor.

8. The transistor of claim 7, wherein the doped region is at least partially in the carrier donor layer and the carrier donor layer comprises a III-N semiconductor material.

9. The transistor of claim 8, wherein the carrier donor layer comprises a same semiconductor material as the first layer.

10. The transistor of claim 1, further comprising a band offset layer between the channel layer and the second layer, wherein the band offset layer comprises a III-N semiconductor material.

11. The transistor of claim 1, wherein the barrier layer further comprises a third layer including a third semiconductor material and a fourth layer including a fourth semiconductor material, wherein the third layer is disposed over the fourth layer, and wherein the third semiconductor material is selectively etchable over the fourth semiconductor material using a dry etching process.

12. The transistor of claim 11, wherein the fourth semiconductor material is selectively etchable over the third semiconductor material using a wet etching process.

13. The transistor of claim 11, wherein the first semiconductor material is the same material as the third semiconductor material and the second semiconductor material is the same material as the fourth semiconductor material.

14. The transistor of claim 1, wherein the first semiconductor material is selectively etchable over the second semiconductor material using a fluorine based dry etching process and the second semiconductor material is etchable using a TMAH based wet etching process, a KOH based wet etching process or digital etching.

15. The transistor of claim 1, wherein the transistor further comprises a source region and a drain region, and wherein the gate is between the source region and the drain region.

16. The transistor of claim 15, wherein a thickness of the barrier layer under the gate recess is below a critical thickness such that the transistor is a normally-off transistor.

17. A transistor, comprising:
a channel layer; and
a barrier layer comprising a first layer including first semiconductor material and a second layer including a second semiconductor material, wherein the first layer is disposed over the second layer, wherein the first semiconductor material is selectively etchable over the second semiconductor material using a dry etching process, and wherein a gate recess is disposed at least in the first layer;
a gate disposed in the gate recess; and
a doped region to provide carriers to the channel layer, wherein the doped region is polarization doped, includes n-type dopants or includes p-type dopants.

18. The transistor of claim 17, wherein the doped region is in the first layer and/or in a carrier donor layer above and/or below the first layer, wherein the doped region is outside of the gate recess and between the gate and a source of the transistor and/or between the gate and a drain of the transistor.

19. The transistor of claim 18, wherein the doped region is at least partially in the carrier donor layer and the carrier donor layer comprises a III-N semiconductor material.

20. The transistor of claim 19, wherein the carrier donor layer comprises a same semiconductor material as the first layer.

21. The transistor of claim 17, further comprising a band offset layer between the channel layer and the second layer, wherein the band offset layer comprises a III-N semiconductor material.

22. The transistor of claim 17, wherein the barrier layer further comprises a third layer including a third semiconductor material and a fourth layer including a fourth semiconductor material, wherein the third layer is disposed over the fourth layer, and wherein the third semiconductor material is selectively etchable over the fourth semiconductor material using a dry etching process.

23. The transistor of claim 22, wherein the first semiconductor material is the same material as the third semiconductor material and the second semiconductor material is the same material as the fourth semiconductor material.

24. A transistor, comprising:
a channel layer; and
a barrier layer comprising a first layer including first semiconductor material and a second layer including a second semiconductor material, wherein the first layer is disposed over the second layer, wherein the first semiconductor material is selectively etchable over the second semiconductor material using a dry etching process, and wherein a gate recess is disposed at least in the first layer;
a gate disposed in the gate recess; and
a doped region to provide carriers to the channel layer, wherein the doped region is in the first layer and/or in a carrier donor layer above and/or below the first layer, wherein the doped region is outside of the gate recess and between the gate and a source of the transistor and/or between the gate and a drain of the transistor.

25. The transistor of claim 24, wherein the doped region is at least partially in the carrier donor layer and the carrier donor layer comprises a III-N semiconductor material.

26. The transistor of claim 25, wherein the carrier donor layer comprises a same semiconductor material as the first layer.

27. The transistor of claim 24, further comprising a band offset layer between the channel layer and the second layer, wherein the band offset layer comprises a III-N semiconductor material.

28. The transistor of claim 24, wherein the barrier layer further comprises a third layer including a third semiconductor material and a fourth layer including a fourth semiconductor material, wherein the third layer is disposed over the fourth layer, and wherein the third semiconductor material is selectively etchable over the fourth semiconductor material using a dry etching process.

29. The transistor of claim 28, wherein the first semiconductor material is the same material as the third semiconductor material and the second semiconductor material is the same material as the fourth semiconductor material.

30. A transistor, comprising:
a channel layer; and
a barrier layer comprising a first layer including first semiconductor material and a second layer including a second semiconductor material, wherein the first layer is disposed over the second layer, wherein the first semiconductor material is selectively etchable over the second semiconductor material using a dry etching process, and
wherein a gate recess is disposed at least in the first layer;
a gate disposed in the gate recess; and
a band offset layer between the channel layer and the second layer, wherein the band offset layer comprises a III-N semiconductor material.

31. The transistor of claim 30, wherein the band offset layer has a composition different from that of the channel layer and the second layer.

32. The transistor of claim 30, wherein the barrier layer further comprises a third layer including a third semiconductor material and a fourth layer including a fourth semiconductor material, wherein the third layer is disposed over the fourth layer, and wherein the third semiconductor material is selectively etchable over the fourth semiconductor material using a dry etching process.

33. The transistor of claim 32, wherein the fourth semiconductor material is selectively etchable over the third semiconductor material using a wet etching process.

34. The transistor of claim 32, wherein the first semiconductor material is the same material as the third semiconductor material and the second semiconductor material is the same material as the fourth semiconductor material.

35. A transistor, comprising:
a channel layer; and
a barrier layer comprising a first layer including first semiconductor material and a second layer including a second semiconductor material, wherein the first layer is disposed over the second layer, wherein the first semiconductor material is selectively etchable over the second semiconductor material using a dry etching process, and
wherein a gate recess is disposed at least in the first layer; and
a gate disposed in the gate recess,
wherein the barrier layer further comprises a third layer including a third semiconductor material and a fourth layer including a fourth semiconductor material, wherein the third layer is disposed over the fourth layer, and wherein the third semiconductor material is selectively etchable over the fourth semiconductor material using a dry etching process.

36. The transistor of claim 35, wherein the fourth semiconductor material is selectively etchable over the third semiconductor material using a wet etching process.

37. The transistor of claim 36, wherein the first semiconductor material is the same material as the third semiconductor material and the second semiconductor material is the same material as the fourth semiconductor material.

38. A semiconductor structure, comprising:
a first layer including a first semiconductor material; and
a second layer including a second semiconductor material,
wherein the first layer is disposed over the second layer, wherein the first semiconductor material is selectively etchable over the second semiconductor material using a dry etching process, and wherein a recess is disposed at least in the first layer,
wherein the first semiconductor material comprises a first III-N semiconductor material and the second semiconductor material comprises a second III-N semiconductor material, and
wherein the first semiconductor material comprises a $B_wAl_xIn_yGa_zN$ material in which x is less than 0.25 and the second semiconductor material comprises a $B_wAl_xIn_yGa_zN$ material in which x is greater than 0.5.

39. The semiconductor structure of claim 38, wherein the second semiconductor material is selectively etchable with respect to a layer above and/or below the second layer using a wet etching process.

40. The semiconductor structure of claim 38, wherein the first semiconductor material comprises GaN and the second semiconductor material comprises AlN.

41. The semiconductor structure of claim 38, wherein the first semiconductor material is selectively etchable over the second semiconductor material using a fluorine based dry etching process and the second semiconductor material is etchable using a TMAH based wet etching process, a KOH based wet etching process or digital etching.

42. A semiconductor structure, comprising:
a first layer including a first semiconductor material; and
a second layer including a second semiconductor material,
wherein the first layer is disposed over the second layer, wherein the first semiconductor material is selectively etchable over the second semiconductor material using a first etching process, and wherein a recess is disposed at least in the first layer,
wherein the first semiconductor material comprises a first III-N semiconductor material and the second semiconductor material comprises a second III-N semiconductor material, and
wherein the first semiconductor material comprises a $B_wAl_xIn_yGa_zN$ material in which x is less than 0.25 and the second semiconductor material comprises a $B_wAl_xIn_yGa_zN$ material in which x is greater than 0.5.

43. The semiconductor structure of claim 42, wherein the second semiconductor material is selectively etchable with respect to a layer above and/or below the second layer using a second etching process.

44. The semiconductor structure of claim 43, wherein the recess is further disposed in the second layer.

45. The semiconductor structure of claim 42, wherein the first semiconductor material comprises a first III-N semiconductor material and the second semiconductor material comprises a second III-N semiconductor material.

* * * * *